United States Patent [19]

Jensen

[11] Patent Number: 4,480,287
[45] Date of Patent: Oct. 30, 1984

[54] MODULE RETAINER APPARATUS

[75] Inventor: Kai Jensen, Wellesley, Mass.

[73] Assignee: Raytheon Company, Lexington, Mass.

[21] Appl. No.: 453,264

[22] Filed: Dec. 27, 1982

[51] Int. Cl.³ .............................................. H05K 7/20
[52] U.S. Cl. .................................... 361/388; 361/386
[58] Field of Search ................ 361/381, 382, 383, 384, 361/385, 386, 387, 388, 389, 413, 399, 415; 165/80 R, 80 A, 80 B, 80 D; 174/16 HS; 339/112 R, 112 L; 211/41

[56] References Cited

U.S. PATENT DOCUMENTS

| | | | |
|---|---|---|---|
| 3,467,891 | 9/1969 | Mogle | 317/101 |
| 3,631,325 | 12/1971 | Wenz | 317/100 |
| 3,845,359 | 10/1974 | Fedele | 211/41 |
| 3,970,198 | 6/1976 | Prater | 211/41 |
| 4,157,583 | 6/1979 | Basmajian et al. | 361/388 |
| 4,214,292 | 7/1980 | Johnson | 361/386 |
| 4,298,903 | 11/1981 | Ellis | 361/386 |
| 4,298,904 | 11/1981 | Koening | 165/80 B |
| 4,318,157 | 3/1982 | Rank et al. | 361/388 |

Primary Examiner—A. D. Pellinen
Assistant Examiner—Greg Thompson

Attorney, Agent, or Firm—Walter F. Dawson; Richard M. Sharkansky; Joseph D. Pannone

[57] ABSTRACT

An improved electronic circuit module retainer apparatus having interlocking, wedge-shaped components which are slotted and keyed together to allow tightening using a single screw which can be turned from the module insertion side of a module enclosure. A module retainer has a minimum of three interlocking parts which are held together by a tightening screw. A center body of the module retainer has holes for attaching it to a module or a module enclosure; it has a U-shaped channel with a square cross section and sloped ends. Each end body has a keying guide extending from a sloped end. A screw extends through a clearance hole in an end-body, then through the center body U-shaped channel and finally into a threaded hole in an opposite end body. When the screw is tightened, the end bodies slide along the sloped ends of the center body causing them to wedge the module against the module enclosure walls. The end bodies are held in alignment with respect to the center body using keying guides which extend from the end bodies into slots in the base of the center body. The interlocking components of the module retainer apparatus also provide a good thermal transfer path.

39 Claims, 9 Drawing Figures

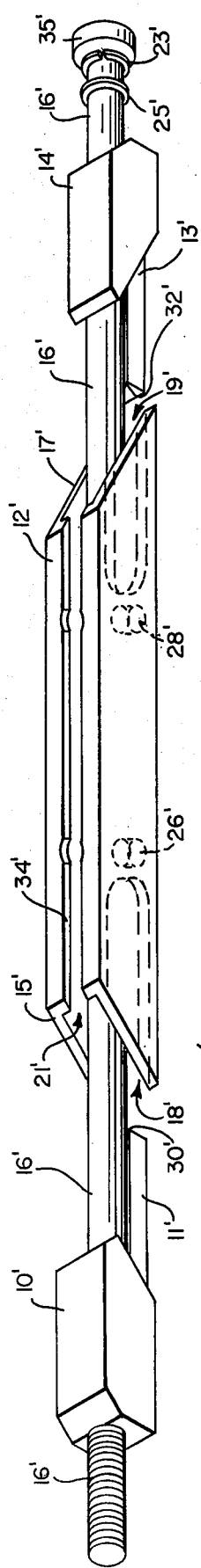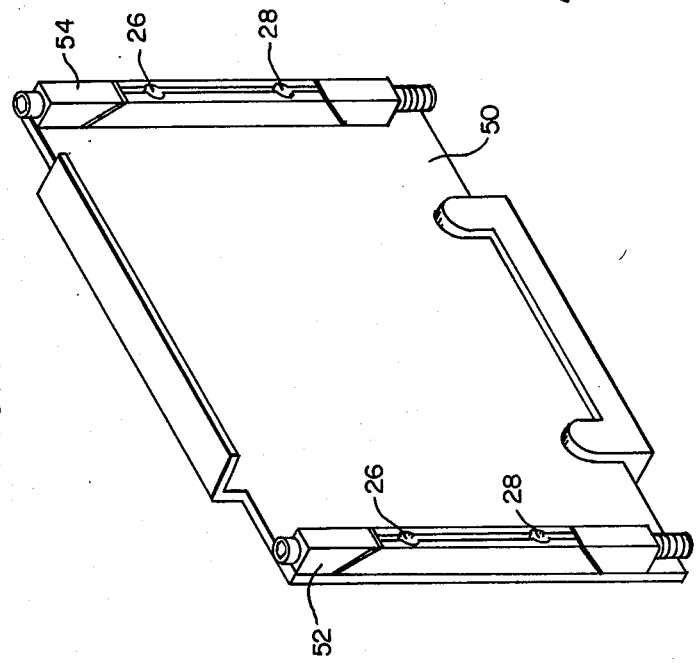
FIG. 7
FIG. 8

MODULE RETAINER APPARATUS

BACKGROUND OF THE INVENTION

The present invention relates to an electronic circuit module retainer apparatus and more particularly to means for not only retaining a module in an enclosure but also providing adequate heat transfer between a module and a heat exchanger enclosure.

In the design of electronic equipment for use in severe environments such as in aircraft and military applications, the method of blowing air over or around electronic modules is often not satisfactory. Conduction cooling of electronic modules via liquid or air cooled heat exchanger enclosures is gaining acceptance for use in military applications.

Adequate structural integrity and heat transfer of an electronic module depends on a steady, low resistance contact between a module heat sink or thermal frame and a heat exchanger enclosure. Various types of module retainers attached to the thermal frame of a module and suitably fastened and torqued into an enclosure or housing have been used. One type of retainer referred to as a "Card-LOK" retainer by its manufacturer Calmark Corp. of San Gabriel, CA provides an efficient heat sink means; it comprises a screw passing through a front wedge, a center body section and a rear wedge having a threaded hole. The screw actuates wedge shape pieces, locks a module in place and provides maximum contact between thermal paths on a module and the heat sink surface of an enclosure. Insertion of a module into an enclosure using this wedge type retainer requires the retainer pieces to be in a loosened condition. However, under-loosening can cause a jam-up between the module and enclosure on insertion and over-loosening can cause one of the end wedges to rotate and prevent insertion; both conditions cause a hang-up between module and enclosure. Mounting a wedge-type of module retainer inside an enclosure rather than on the module greatly increases the above problems and can result in severe damage to an electronic assembly. The present invention incorporates anti-hang-up, non-rotation, and fool-proof module insertion features to eliminate the problems experienced with the prior art wedge type retainer.

SUMMARY OF THE INVENTION

This invention discloses an improved module retainer having interlocking wedge-shaped components. The module retainer may be attached to a module or a module enclosure for securing a module within a module enclosure and for providing a good thermal transfer path between a module and a module enclosure. One embodiment of the module retainer for smaller type modules comprises three component bodies interlocked by a screw. Another embodiment of the invention for larger type modules comprises five component bodies interlocked by a screw.

The embodiment of a module retainer for smaller type modules comprises a center body with a first sloping end and a second sloping end, a slot in each of the sloping ends of the center body, a first end body including a keying guide extending from a lower portion of its sloping end face for insertion into the first sloping end slot of the center body, a second end body including a keying guide extending from a lower portion of its sloping end face for insertion into the second sloping end slot of the center body, and a screw extending through the first end body, the center body and the second end body which comprises a threaded hole or threaded insert for tightening the screw. The center body further comprises a U-shape channel with upper side lips for facilitating movement of the screw during tightening as the sloping end faces of the first end body and the second end body slide along adjacent faces of the sloping ends of the center body.

The embodiment of a module retainer for larger type modules comprises at least three center bodies including a first center body having sloping end faces with a slot extending into each of the sloping end faces, a second center body having sloping end faces, each one of the sloping end faces including a keying guide extending from a lower portion of the sloping end faces for insertion into adjacent center bodies, a third center body having sloping end faces, with a slot extending into each one of the sloping end faces, a first end body including a keying guide extending from a lower portion of a sloping end face of the first end body for insertion into the slot of the first center body, a second end body including a keying guide extending from a lower portion of a sloping end face of the second end body for insertion into the slot of the third center body, a screw extending serially through the first end body, the first center body, the second center body, the third center body, and the second end body which comprises a threaded hole or threaded insert for tightening the screw. Each of the first, second and third center bodies comprises a U-shape channel with upper side lips for facilitating movement of the screw during tightening as the sloping end faces of each of the end bodies and center bodies slide along adjacent sloping end faces of end bodies and center bodies.

BRIEF DESCRIPTION OF THE DRAWINGS

Other and further features and advantages of the invention will become apparent in connection with the accompanying drawings wherein:

FIG. 7 is an isometric projection of the invention with top-to-bottom holes in the center body for riveting to a module;

FIG. 8 is an isometric illustration of a module showing a pair of module retainers positioned on opposite sides of said module.

BRIEF DESCRIPTION OF THE PREFERRED EMBODIMENT

Figure 1:
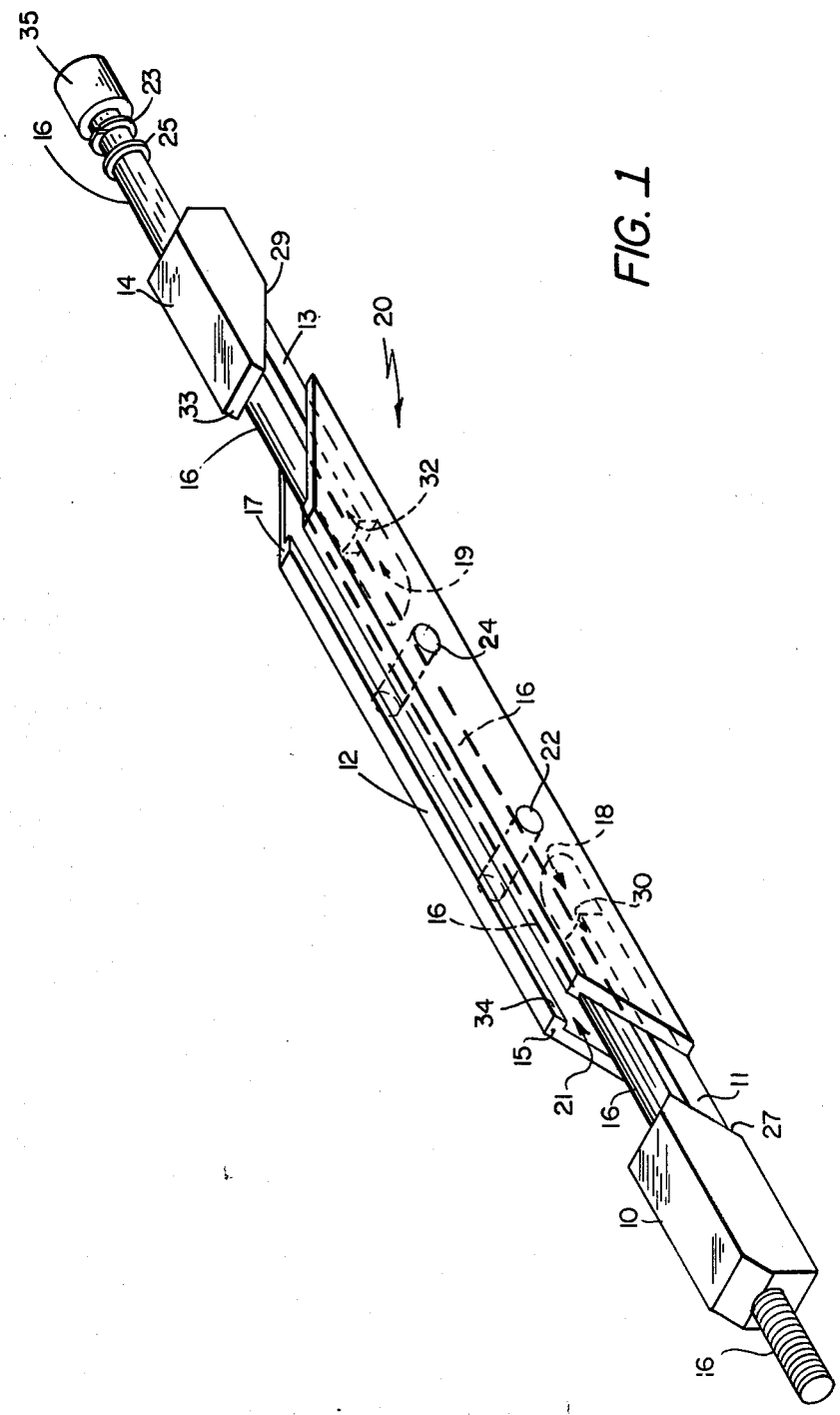
FIG. 1 is an isometric illustration of the invention with holes in the center body for riveting to a module enclosure.
Figure 6:
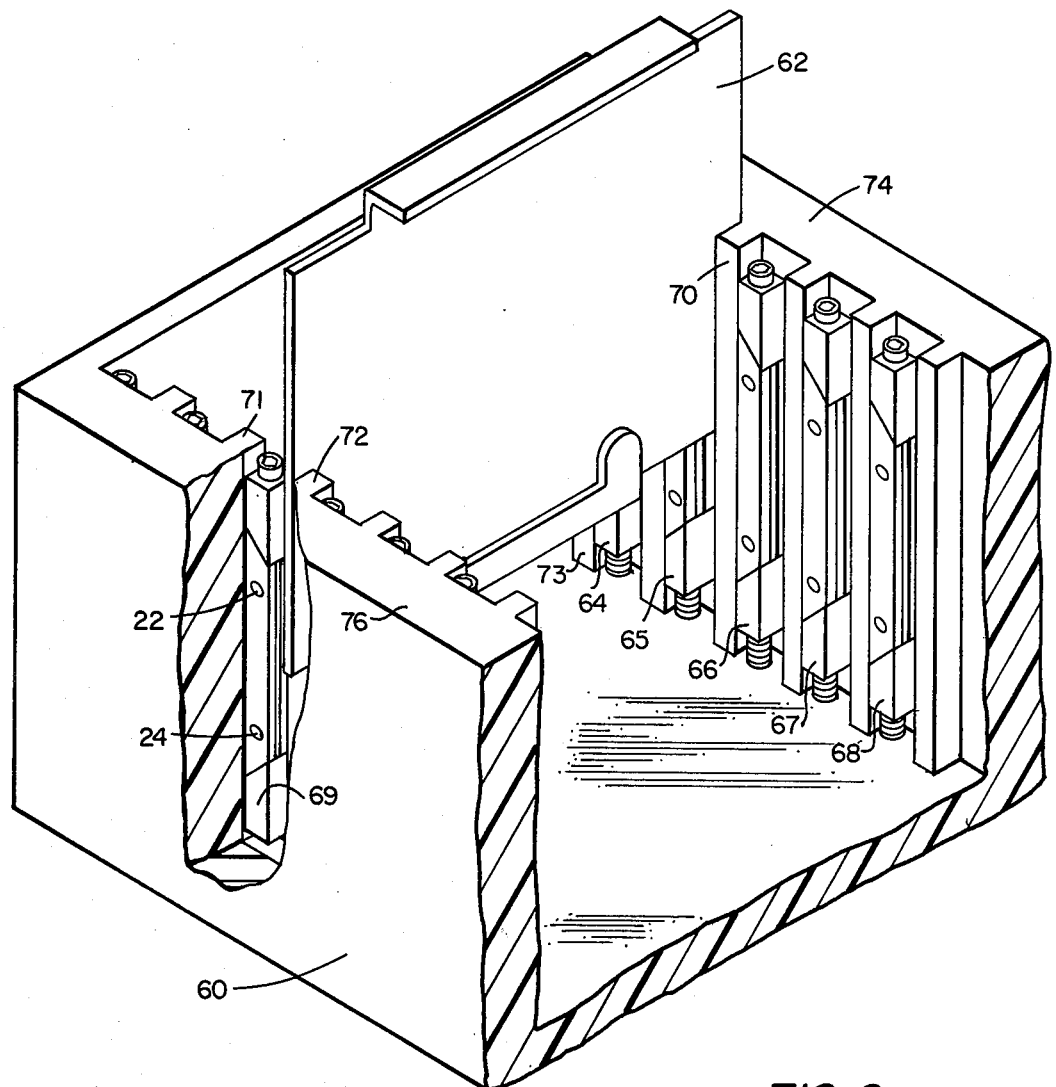
FIG. 6 is an isometric illustration of a module enclosure showing the invention attached to opposing walls of said module enclosure and a module partially inserted between the side wall flanges and the module retainers.

Referring now to FIG. 1, an assembled module retainer apparatus 20 is illustrated comprising a center body 12, two end bodies 10 and 14 including keying guides 11 and 13 for insertion into a slot in each end of said center body 12 and a screw 16 for tightening the interlocking parts together. A center body 12 has a first sloping end face 15 and a second sloping end face 17 at each end of said center body. A U-shaped channel 21 exists through the center body 12 and slots 18 and 19 are located in the base of the center body 12 at each end. Each slot is of sufficient length to receive keying guides 11 and 13. Holes 22 and 24 in the side of the center body 12 are for attaching said center body in a module enclosure as shown in FIG. 6. FIG. 7 shows a module retainer 20' which is an alternate embodiment of the present invention with holes 26' and 28' extending from top to bottom of center body 12' for attaching said center body to a module 50 as shown in FIG. 8. The attachment in a module enclosure (or on a module) may be accomplished with rivets or other attaching means so long as there is minimal protrusion into the U-shaped channel without interferring with the movement of screw 16'. The length of a center body 12 depends on a particular application; it may be an aluminum alloy or stainless steel extrusion to provide sufficient strength and a good thermal transfer path.

Still referring to FIG. 1, the end bodies 10 and 14 each have a keying guide 11 and 13 protruding from the lower portion of sloping end faces 27 and 29 for insertion into slots 18 and 19 at each end of the center body 12. The keying guides 11 and 13 each have an upper concave surface 30 and 32 for providing clearance space for screw 16 which is positioned above said keying guides 11 and 13 in an assembled module retainer 20. The top edge 33 of each end body 10 and 14 at the beginning of the sloping end faces has a slight chamfer at approximately 45 degrees to prevent hooking on to something by sharp edges during module insertion and extraction operations of a module retainer 20 in a module enclosure. Screw 16 extends through a clearance hole in the first end body 14, through the U-shaped channel 21 of center body 12 and through a threaded hole (4-40 tapped) in the second end body 10. The screw 16 may be embodied as a 4-40 stainless steel with a hex socket head 35 (for spin tight use) or a slot (for screw driver) and it has a lock washer 23 and a flat washer 25 between the head 35 and an end body 14. The tightening of screw 16 causes the keying guides 11 and 13 of the end bodies 10 and 14 to be inserted into slots 18 and 19 of center body 12, thereby providing an interlocking module retainer assembly. The end bodies 10 and 14 may be embodied with stainless steel by die forging or precision casting which not only provides strength but also a good thermal transfer path.

Figure 2:
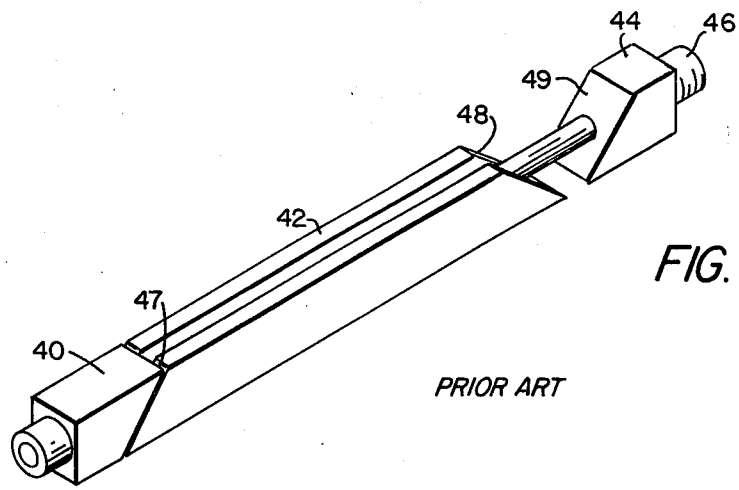
FIG. 2 is an isometric illustration of a prior art module retainer showing one end body rotated 180° from a normal alignment position.

Referring now to FIG. 2, there is shown a module retainer of the prior art including a first end body 40, a center body 42, a second end body 44 and a screw 46 extending through each of the aforementioned bodies. There are no keying guides protruding from the end bodies 40 and 44 nor are there slots in the ends of the center body 42 for receiving said keying guides. As a result of not having keying guides and slots, an end body 44 can readily turn 180°, as shown in FIG. 2 which prevents proper operation of a module retainer. In this case when the screw 46 is tightened, the sloping end surfaces 48 and 49 of center body 42 and end body 44 respectively will butt each other and not slide along each other's sloping surfaces 48 and 49. When module retainers are attached to a module, as shown in FIG. 8, this problem although cumbersome and annoying may be tolerated since it is correctable by removing a module from a module enclosure and realigning the end bodies with the center body. However, if module retainers are attached to the walls of a module enclosure as shown in FIG. 6, such a problem would not be tolerable and generally precludes said prior art retainers from being used in this manner because the realignment of the end bodies with a center body is not easily accomplished due to the dense packaging of modules.

Figure 3:
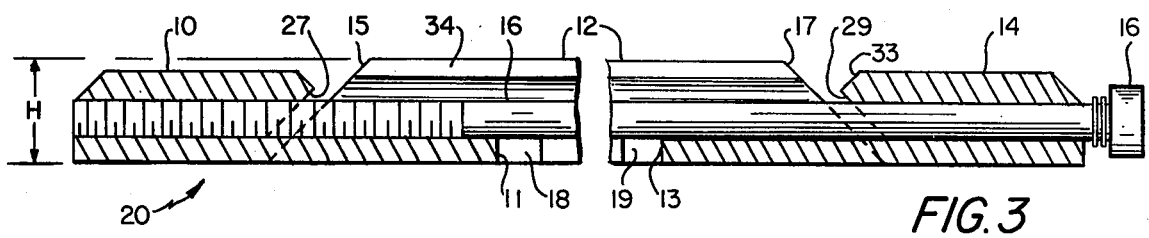
FIG. 3 is a cross-sectional view of the invention, partially broken away, when the screw is not tightened.

A cross section of the assembled module retainer 20 of FIG. 1 is shown in FIG. 3 which further shows the screw 16 in a loosened position and the sloping faces 27 and 29 of the end bodies 10 and 14 separated from the sloping end faces 15 and 17 of the center body 12. The optimum angle with respect to a horizontal reference of the center body 12, sloping end faces 12 and 17 is between 30 degrees and 45 degrees. Likewise, the angle of the complementary sloping end faces 27 and 29 of end bodies 10 and 14 respectively is selected to be identical to the angle for said center body end faces 12 and 17. If the angle selected is too steep, then the coefficient of friction of the sloping faces will be too high requiring excessive torque to secure a module. If the angle selected is too shallow, then the length of the sloping faces take up too much space.

Figure 4:
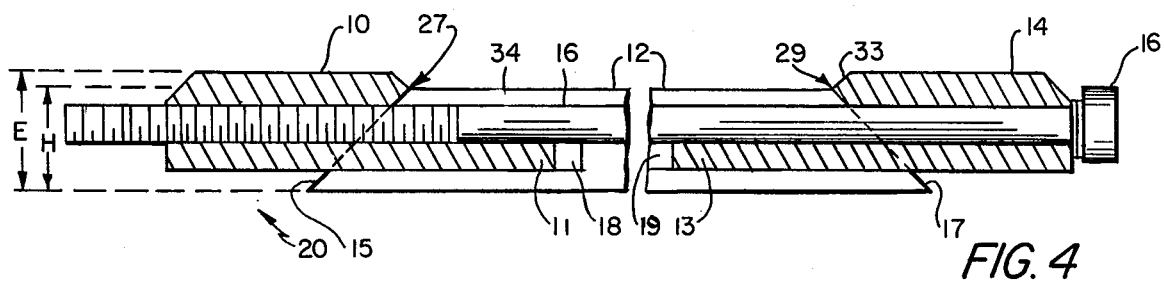
FIG. 4 is a cross-sectional view of the invention, partially broken away, when the screw is tightened and the end bodies have risen above the center body to secure a module in a module enclosure.

The height (H) of module retainer 20 is determined by the height of the center body 12 when the screw 16 is loosened. However, when the screw 16 is tightened, as shown in FIG. 4, the sloping faces 27 and 29 of end bodies 10 and 14 slide up along the end faces 15 and 17 of center body 12, and the height of the module retainer expands from height H to height E. The total amount of expansion, $E_{max}$, is limited by the upper overhanging side lips 34 of the U-shaped center-body. As the screw 16 is tightened, it rises as the end bodies 10 and 14 rise. This expansion causes a module to be secured or retained in a module enclosure as shown in FIG. 6 by the resulting "wedging action". In addition, the complementary sloping end faces 15, 27 and 17, 29 pressure contact with each other of module retainer 69 as shown in FIG. 6 result in a secondary thermal transfer path being established between one side of a metal frame of a module 62 and side wall flanges 71 and 73 of the cooling side walls 74 and 76 of a module enclosure 60. The primary thermal transfer path is provided by the other side of the metal frame of a module 60 wedged in close contact with side wall flanges 70 and 72 of said cooling walls 74 and 76 of the module enclosure 60.

Figure 5:
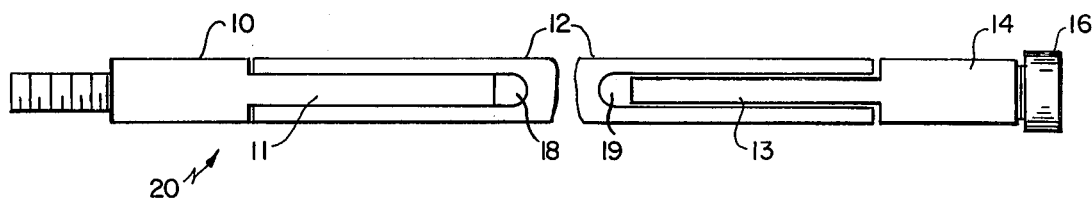
FIG. 5 is a bottom view of the invention, partially broken away, showing the keying guides inserted into the slots of the center body.

Referring now to FIG. 5, a bottom view of a module retainer 20 shows the keying guides 11 and 13 inserted into the slots 18 and 19 of the center body 12. As the screw tightening action occurs, keying guides 11 and 13 move further into slots 18 and 19. As screw loosening action occurs, part of the keying guides 11 and 13 move out of slots 18 and 19 but a sufficient amount of said guides remains in said slots to always maintain the proper alignment of the end bodies 10 and 14 with the center body 12.

Referring now to FIG. 6, a portion of a module enclosure apparatus 60 is illustrated showing a module 62 partially inserted between side wall flanges 70 and 72 and module retainers 65 and 69. Each one of the module retainers 64–69 is the same as the module retainer 20 shown in FIG. 1. They are attached to the side walls 74 and 76 of the module enclosure 60 by rivets or bonding. When the single screw 16 of module retainers 65 and 69 is tightened from the module insertion side of a module enclosure 60, an expansion as shown in FIG. 4 occurs as the end bodies 10 and 14 slide up along the end faces 15 and 17 of center body 12 securing or wedging module 62 between said module retainer 65 and flange 70 on one side and between module retainer 69 and flange 72 on the other side of module enclosure 60. This pressure contact of the metal frame side surfaces of the module 62 against the flanges 70 and 72 of the enclosure side walls 74 and 76 provide an efficient heat transfer path between electronic components (not shown) which are usually mounted upon the module and the heat sinks formed by the side walls 74 and 76.

Referring now to FIG. 8, two module retainers 52 and 54 are shown attached to opposite sides of a module 50. The attachment may be accomplished by bonding or by the use of rivets through holes 26 and 28. Although not shown in FIG. 8, a module would normally comprise in addition to a metal frame, a printed circuit board with a plurality of electronic components including integrated circuits requiring a thermal transfer path for cooling said components.

Referring now to FIG. 7, an alternate embodiment of the present invention is illustrated. The only differences between this embodiment and the embodiment as shown in FIG. 1 is the location of the attachment holes 26 and 28 which extend from top to bottom of the center body 12'. All of the remaining elements are the same as described for FIG. 1.

Figure 9:
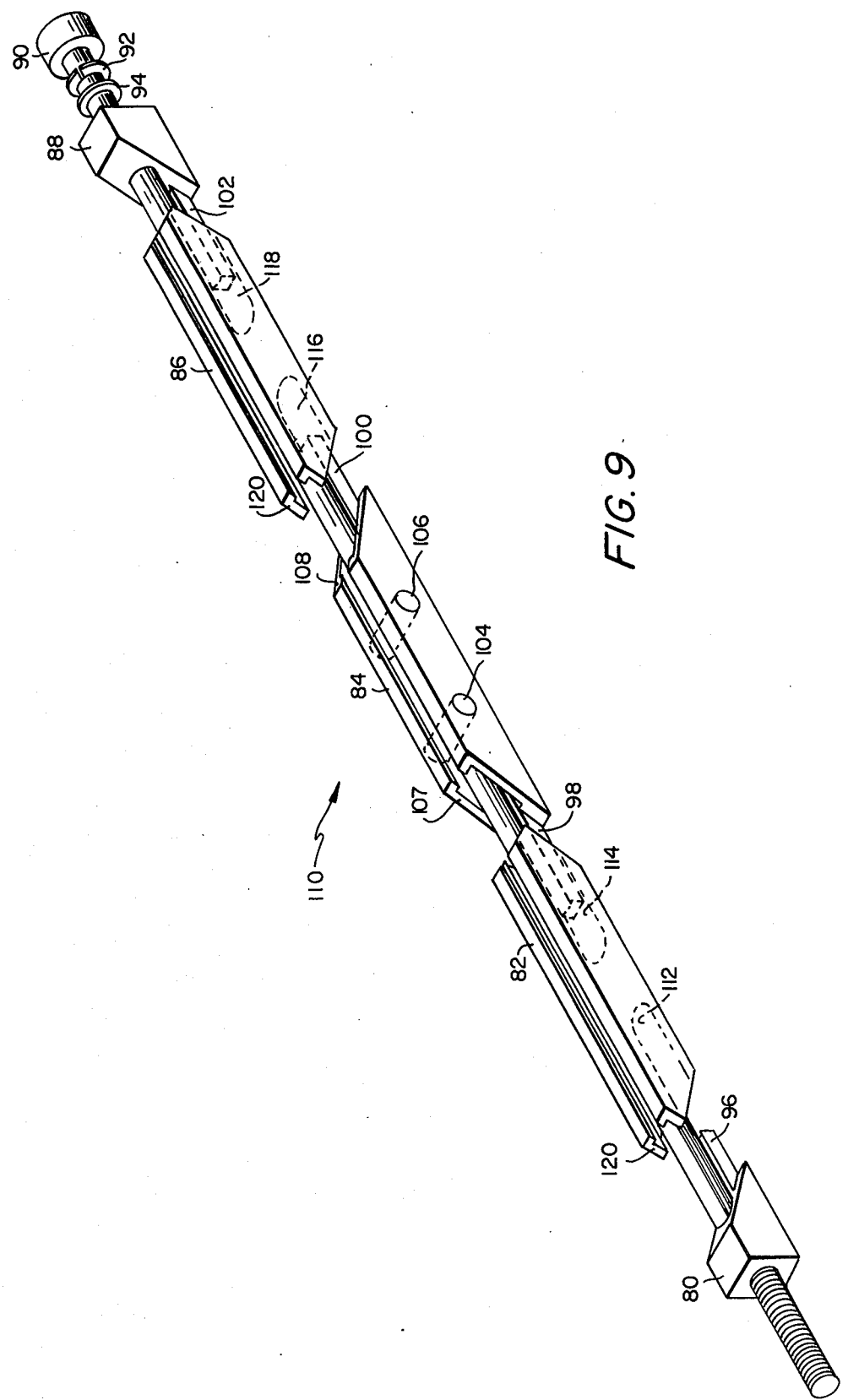
FIG. 9 is an isometric illustration of an alternate embodiment of the invention comprising a plurality of center bodies for use with larger modules and module enclosures.

Referring now to FIG. 9, a multi-center body module retainer 110 is shown which is another alternate embodiment of the present invention comprising a plurality of center bodies 82, 84 and 86 wedged between end bodies 80 and 88 and assembled together with a screw 90. End body 80 comprises threading means for accepting screw 90. Center body 84 comprises holes 104 and 106 to facilitate mounting to a module enclosure 60 of FIG. 6 or center body 84 may have holes extending from top to bottom (not shown) similar to holes 26 and 28 in module retainer 20' as shown in FIG. 7. A multi-center body module retainer 110 is used in applications where a module retainer 20, as shown in FIG. 1, is considered too short to properly secure a module into a module enclosure.

Still referring to FIG. 9, center body 84 comprises keying guides 98 and 100 extending from each of its sloping end surfaces 107 and 108. End bodies 80 and 88 include keying guides 96 and 102 extending from each of their sloping faces. Center bodies 82 and 86 have slots 112, 114, 116, 118 located in their bases at each end for accepting keying guides of adjacent bodies. The top end edges 120 of center bodies 82 and 86 at the beginning of the sloping end faces have a slight chamfer at approximately 45 degrees to prevent hooking onto something by sharp edges during module insertion and extraction operations of a module retainer 110 in a module enclosure. The keying guides and slots of the aforesaid bodies provide for an improved interlocking module retainer assembly similar to the module retainer 20, as shown in FIG. 1.

The operation of module retainer 110 is similar to that of module retainer 20, as described and shown in FIGS. 3 and 4; however, in this case center bodies 82 and 86 are forced to move in an upward direction when screw 90 is tightened by the "wedging action" of end body 80 and center body 84 on either side of center body 82 and the "wedging action" of center body 84 and end body 88 on either side of center body 86. The expansion in height of module retainer 110 secures a module inserted into a module enclosure and provides very good thermal transfer paths for proper cooling of electronic components on a module.

This concludes the description of the preferred embodiment of the invention described herein. However, many modifications and alterations will be obvious to one skilled in the art without departing from the spirit and scope of the inventive concept. Therefore, it is intended that the scope of this invention be limited only by the appended claims.

What is claimed is:

1. A module retainer comprising:
    a center body including a first sloping end and a second sloping end;
    a slot in each of said sloping ends of said center body;
    a first end body including a keying guide extending from a lower portion of a sloping end face of said first end body for insertion into said first sloping end slot of said center body;
    a second end body including a keying guide extending from a lower portion of a sloping end face of said second end body for insertion into said second sloping end slot of said center body; and
    a screw extending through said first end body, said center body and said second end body, said second end body comprising a threaded means for tightening said screw.

2. The module retainer according to claim 1 wherein: said center body comprises a U-shape channel with upper side lips for facilitating movement of said screw during tightening as said sloping end faces of said first end body and said second end body slide along adjacent faces of said sloping ends of said center body.

3. The module retainer according to claim 2 wherein: each of said center body sloping end faces comprises an optimum angle preferably in a range of thirty degrees to forty-five degrees for minimizing coefficient of friction effects and the length of said sloping end faces.

4. The module retainer according to claim 3 wherein: said sloping end faces of said first end body and said second end body comprises an optimum angle preferably in a range of thirty degrees to forty-five degrees.

5. The module retainer according to claim 1 wherein: said screw tightened first end body, said center body and said second end body provide a thermal transfer path between a module and a module enclosure.

6. A module retainer comprising:
    a center body including a first sloping end and a second sloping end;
    a slot in each of said sloping ends of said center body;
    a first end body including a keying guide extending from a lower portion of a sloping end face of said first end body for insertion into said first sloping end slot of said center body;
    a second end body including a keying guide extending from a lower portion of a sloping end face of said second end body for insertion into said second sloping end slot of said center body;

a screw extending through said first end body, said center body and said second end body, said second end body comprising a threaded means for tightening said screw; and holes in said center body for attaching said module retainer to a module or a module enclosure surface.

7. The module retainer according to claim 6 wherein:
said center body comprises a U-shape channel with upper side lips for facilitating movement of said screw during tightening as said sloping end faces of said first end body and said second end body slide along adjacent faces of said sloping ends of said center body.

8. The module retainer according to claim 7 wherein:
each of said center body sloping end faces comprises an optimum angle preferably in a range of thirty degrees to forty-five degrees for minimizing coefficient of friction effects and the length of said sloping end faces.

9. The module retainer according to claim 8 wherein:
said sloping end face of said first end body and said second end body comprises an optimum angle preferably in a range of thirty degrees to forty-five degrees.

10. The module retainer according to claim 6 wherein:
said screw tightened first end body, said center body and said second end body provide a thermal transfer path between a module and a module enclosure.

11. A pair of thermal transfer module retainers positioned on opposite sides of a module, each of said module retainers comprising:
a center body including a first sloping end and a second sloping end;
a slot in each of said sloping ends of said center body;
a first end body including a keying guide extending from a lower portion of a sloping end face of said first end body for insertion into said first sloping end slot of said center body;
a second end body including a keying guide extending from a lower portion of a sloping end face of said second end body for insertion into said second sloping end slot of said center body; and
a screw extending through said first end body, said center body and said second end body, said second end body comprising a threaded means for tightening said screw; and
holes in said center body for attaching said module retainer to said module.

12. The module retainers according to claim 11 wherein:
said center body comprises a U-shape channel with upper side lips for facilitating movement of said screw during tightening as said sloping end faces of said first end body and said second end body slide along adjacent faces of said sloping ends of said center body.

13. The module retainer according to claim 12 wherein:
each of said center body sloping end faces comprises an optimum angle preferably in a range of thirty degrees to forty-five degrees for minimizing coefficient of friction effects and the length of said sloping end faces.

14. The module retainers according to claim 13 wherein:
said sloping end face of said first end body and said second end body comprises an optimum angle preferably in a range of thirty degrees to forty-five degrees.

15. The combination according to claim 11 wherein:
said threaded means of said second end body comprises a threaded insert.

16. The combination according to claim 11 wherein:
said threaded means of said second end body comprises a threaded hole.

17. The module retainers according to claim 11 wherein:
said screw tightened first end body, said center body and said second body of each module retainer provide a thermal transfer path between said module and said module enclosure.

18. In combination:
a module enclosure for holding a plurality of modules, one side of said enclosure capable of being opened to permit an insertion and removal of said modules;
a plurality of flanges on two opposing walls of said module enclosure for providing conduction cooling for a plurality of said modules;
a plurality of module retainers attached to said opposing walls of said module enclosure or to a module for securing said modules in said module enclosure and for providing a good thermal transfer path between said modules and said flanges of said module enclosure walls;
each of said module retainers comprising a center body including a first sloping end and a second sloping end;
a slot in each of said sloping ends of said center body;
a first end body including a keying guide extending from a lower portion of a sloping end face of said first end body for insertion into said first sloping end slot of said center body;
a second end body including a keying guide extending from a lower portion of a sloping end face of said second end body for insertion into said second sloping end slot of said center body; and
a screw extending through said first end body, said center body and said second end body, said second end body comprising a threaded means for tightening said screw.

19. The combination according to claim 18 wherein:
each module is secured in said module enclosure by tightening said module retainers on each side of said module.

20. The combination according to claim 18 wherein:
said center body comprises a U-shape channel with upper side lips for facilitating movement of said screw during tightening as sloping end faces of said first end body and said second end body slide along adjacent faces of said sloping end of said center body.

21. The combination according to claim 20 wherein:
each of said center body sloping end faces comprises an optimum angle preferably in a range of thirty degrees to forty-five degrees for minimizing coefficient of friction effects and the length of said sloping end faces.

22. The combination according to claim 21 wherein:
said sloping end face of said first end body and said second end body comprises an optimum angle preferably in a range of thrity degrees to forty-five degrees.

23. The combination according to claim 18 wherein:

said threaded means of said second end body comprises a threaded insert.

24. The combination according to claim 18 wherein: said threaded means of said second end body comprises a threaded hole.

25. The combination according to claim 18 wherein: said screw tightened first end body, said center body and said second end body of each module retainer provide said thermal transfer path between said module and said module enclosure.

26. A module retainer comprising:
at least three center bodies including a first center body having sloping end faces with a slot extending into each of said sloping end faces;
a second center body having sloping end faces, each one of said sloping end faces including a keying guide extending from a lower portion of said sloping end faces for insertion into adjacent center bodies;
a third center body having sloping end faces, with a slot extending into each one of said sloping end faces;
a first end body including a keying guide extending from a lower portion of a sloping end face of said first end body for insertion into said slot of said first center body;
a second end body including a keying guide extending from a lower portion of a sloping end face of said second end body for insertion into said slot of said third center body; and
a screw extending serially through said first end body, said first center body, said second center body, said third center body, and said second end body, said second end body comprising a threaded means for tightening said screw.

27. The module retainer according to claim 26 wherein:
at least one of said first, second and third center bodies comprises holes for attaching said module retainer to a module or a module enclosure surface.

28. The module retainer according to claim 26 wherein:
each of said center bodies comprises a U-shape channel with upper side lips for facilitating movement of said screw during tightening as said sloping end faces of each of said end bodies and said center bodies slide along adjacent sloping end faces of said end bodies and said center bodies.

29. The module retainer according to claim 28 wherein:
each of said first, second and third center body sloping end faces comprises an optimum angle preferably in a range of thirty degrees to forty-five degrees for minimizing coefficient of friction effects and the length of said sloping end faces; and
each of said sloping end faces of said first end body and said second end body comprises an optimum angle preferably in a range of thirty degrees to forty-five degrees.

30. The module retainer according to claim 26 wherein:
said threaded means of said second end body comprises a threaded insert.

31. The module retainer according to claim 26 wherein:
said threaded means of said second end body comprises a threaded hole.

32. The module retainer according to claim 26 wherein:
said screw tightened end bodies and center bodies provide a thermal transfer path between a module and a module enclosure.

33. In combination:
a module enclosure for holding a plurality of modules, one side of said enclosure capable of being opened to permit an insertion and removal of said modules;
a plurality of flanges on two opposing walls of said module enclosure for providing conduction cooling for a plurality of said modules;
a plurality of module retainers attached to said opposing walls of said module enclosure or to a module for securing said modules in said module enclosure and for providing a good thermal transfer path between said modules and said flanges of said module enclosure walls;
each of said module retainers comprising at least three center bodies including a first center body having sloping end faces with a slot extending into each of said sloping end faces;
a second center body having sloping end faces, each one of said sloping end faces including a keying guide extending from a lower portion of said sloping end faces for insertion into adjacent center bodies;
a third center body having sloping end faces, with a slot extending into each one of said sloping end faces;
a first end body including a keying guide extending from a lower portion of a sloping end face of said first end body for insertion into said slot of said first center body;
a second end body including a keying guide extending from a lower portion of a sloping end face of said second end body for insertion into said slot of said third center body; and
a screw extending serially through said first end body, said first center body, said second center body, said third center body, and said second end body, said second end body comprising a threaded means for tightening said screw.

34. The combination according to claim 33 wherein:
at least one of said first, second and third center bodies comprises holes for attaching said module retainer to a module or a module enclosure surface.

35. The combination according to claim 33 wherein:
each of said center bodies comprises a U-shape channel with upper side lips for facilitating movement of said screw during tightening as said sloping end faces of each of said end bodies and said center bodies slide along adjacent sloping end faces of said end bodies and said center bodies.

36. The combination according to claim 35 wherein:
each of said first, second and third center body sloping end faces comprises an optimum angle preferably in a range of thirty degrees to forty-five degrees for minimizing coefficient of friction effects and the length of said sloping end faces; and
each of said sloping end faces of said first end body and said second end body comprises an optimum angle preferably in a range of thirty degrees to forty-five degrees.

37. The combination according to claim 33 wherein:
said threaded means of said second end body comprises a threaded insert.

38. The combination according to claim 33 wherein:
said threaded means of said second end body comprises a threaded hole.

39. The combination according to claim 33 wherein:
said screw tightened end bodies and center bodies provide a thermal transfer path between a module and a module enclosure.

* * * * *